United States Patent
Lee et al.

(10) Patent No.: US 10,008,535 B2
(45) Date of Patent: Jun. 26, 2018

(54) IMAGE SENSOR HAVING FIRST FIXED CHARGE FILM FOR ANTI-REFLECTION AND SECOND FIXED CHARGE FILM FOR MOISTURE PROTECTION

(71) Applicant: Samsung Electronics Co., Ltd., Suwon-si, Gyeonggi-do (KR)

(72) Inventors: Seokha Lee, Hwaseong-si (KR); Kyungah Jeon, Hwaseong-si (KR); Yunki Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 100 days.

(21) Appl. No.: 15/090,883

(22) Filed: Apr. 5, 2016

(65) Prior Publication Data

US 2017/0047371 A1 Feb. 16, 2017

(30) Foreign Application Priority Data

Aug. 11, 2015 (KR) .................. 10-2015-0113386

(51) Int. Cl.
*H01L 27/146* (2006.01)

(52) U.S. Cl.
CPC .... *H01L 27/14643* (2013.01); *H01L 27/1464* (2013.01); *H01L 27/14621* (2013.01); *H01L 27/14627* (2013.01)

(58) Field of Classification Search
CPC .......... H01L 27/1463; H01L 21/76224; H01L 27/14806; H01L 29/78603
USPC .................................. 250/208.1, 214 R, 239
See application file for complete search history.

(56) References Cited

U.S. PATENT DOCUMENTS

| | | | |
|---|---|---|---|
| 8,288,836 B2 | 10/2012 | Oshiyama et al. | |
| 9,373,656 B2 * | 6/2016 | Park | H01L 27/1462 |
| 9,741,758 B2 * | 8/2017 | Kim | H01L 27/1463 |
| 2014/0054662 A1 | 2/2014 | Yanagita et al. | |
| 2015/0028442 A1 | 1/2015 | Miyanami | |
| 2015/0091121 A1 | 4/2015 | Manda et al. | |

* cited by examiner

*Primary Examiner* — Que T Le
(74) *Attorney, Agent, or Firm* — Harness, Dickey & Pierce, P.L.C.

(57) ABSTRACT

An image sensor includes a substrate including a plurality of photoelectric conversion parts and a pixel isolation trench extending from a surface of the substrate between the photoelectric conversion parts, a first fixed charge film directly on the surface of the substrate, a second fixed charge film directly on the first fixed charge film and an inner wall of the pixel isolation trench, and an insulating layer directly on the second fixed charge film, the insulating layer configured to fill the pixel isolation trench.

20 Claims, 12 Drawing Sheets

IMAGE SENSOR HAVING FIRST FIXED CHARGE FILM FOR ANTI-REFLECTION AND SECOND FIXED CHARGE FILM FOR MOISTURE PROTECTION

CROSS-REFERENCE TO RELATED APPLICATION

This application claims priority under 35 U.S.C. § 119 to Korean Patent Application No. 10-2015-0113386, filed on Aug. 11, 2015, the disclosure of which is hereby incorporated by reference in its entirety.

BACKGROUND

Field

Some example embodiments of the inventive concepts relate to an image sensor having a fixed charge film and a method of manufacturing the same. Other example embodiments relate to an image sensor having both a first fixed charge film serving as an anti-reflection layer and a second fixed charge film serving as a moisture protection layer.

Description of Related Art

Image sensors with a higher resolution have been developed in order to produce relatively high-quality picture images. The image sensor of higher resolution has a higher density and a smaller size. Thermal electrons are generated from a silicon surface to cause a dark current, dark level defects, white spot defects, and/or blooming defects of the image sensor.

SUMMARY

Example embodiments of the inventive concepts provide an image sensor having both a first hole accumulation layer serving as anti-reflection and a second hole accumulation layer serving as moisture protection.

Example embodiments of the inventive concepts provide a method of manufacturing an image sensor having both a first hole accumulation layer serving as anti-reflection and a second hole accumulation layer serving as moisture protection.

Example embodiments of the inventive concepts suppresses the dark current, dark level defects, white spot defects, and/or blooming defects from occurring and suppresses or prevents the penetration of moisture, and thus the density therewith is improved.

The technical objectives of the inventive concepts are not limited to the above disclosure, and other objectives may become apparent to those of ordinary skill in the art based on the following descriptions.

In accordance with example embodiments of the inventive concepts, an image sensor includes a substrate including a plurality of photoelectric conversion parts and a pixel isolation trench extending from a surface of the substrate between the photoelectric conversion parts, a first fixed charge film directly on the surface of the substrate, a second fixed charge film directly on the first fixed charge film and an inner wall of the pixel isolation trench, and an insulating layer directly on the second fixed charge film and configured to fill the pixel isolation trench.

In example embodiments, the first fixed charge film and the second fixed charge film may include a metal oxide. The insulating layer may include a non-metal oxide.

In example embodiments, the first fixed charge film may include one of hafnium oxide, hafnium silicon oxide, titanium oxide, zirconium oxide, magnesium oxide, tantalum oxide, scandium oxide, lutetium oxide, yttrium oxide, and lanthanum oxide.

In example embodiments, the second fixed charge film may include aluminum oxide.

In example embodiments, the insulating layer may include silicon oxide.

In example embodiments, the image sensor may further include a first hole accumulation region between a lower portion of the first fixed charge film and upper portions of the photoelectric conversion parts, and a second hole accumulation region along a sidewall and a bottom surface of the pixel isolation trench in the substrate.

In example embodiments, the first fixed charge film and the second fixed charge film may include different metals, and may be on the first hole accumulation region. The second fixed charge film may be on side surfaces of the second hole accumulation region.

In example embodiments, the insulating layer may have a planar upper surface configured to extend onto the second fixed charge film.

In example embodiments, the image sensor may further include an air gap inside the pixel isolation trench.

In accordance with example embodiments of the inventive concepts, an image sensor includes a lower substrate, a lower interlayer insulating layer on the lower substrate, an upper interlayer insulating layer on the lower interlayer insulating layer, an upper substrate on the upper interlayer insulating layer, the upper substrate including a pixel isolation trench configured to define pixel regions in the substrate, and extending into the upper substrate from an upper surface of the upper substrate, a first insulating layer directly on the upper surface of the upper substrate, the first insulating layer including a metal oxide, a second insulating layer directly on the first insulating layer and inner walls of the pixel isolation trench, the second insulating layer including a metal oxide having a lower refractive index than the first insulating layer, and a third insulating layer directly on the second insulating layer and configured to fill the pixel isolation trench.

In example embodiments, the first insulating layer may not extend into the pixel isolation trench.

In example embodiments, the image sensor may further include a plurality of color filters on the third insulating layer and vertically arranged with the photoelectric conversion parts, and a plurality of micro-lenses on the color filters.

In example embodiments, the lower interlayer insulating layer may include a lower interconnection. The upper interlayer insulating layer may include an upper interconnection.

In example embodiments, the first insulating layer and the second insulating layer may be on the upper surface of the upper substrate and may include different metals. The second insulating layer may be on the inner walls and a bottom surface of the pixel isolation trench.

In accordance with example embodiments of the inventive concepts, an image sensor includes a substrate including a plurality of photoelectric conversion parts and a pixel isolation trench configured to extend between the photoelectric conversion parts from a surface of the substrate, a first metal oxide film conformally formed on the surface of the substrate, the first metal oxide film including a first metal oxide, and a second metal oxide film conformally formed on the first metal oxide film and an inner wall of the pixel isolation trench, the second metal oxide film including a second metal oxide different from the first metal oxide.

In example embodiments, the first metal oxide may include one of hafnium oxide, hafnium silicon oxide, titanium oxide, zirconium oxide, magnesium oxide, tantalum oxide, scandium oxide, lutetium oxide, yttrium oxide, and lanthanum oxide.

In example embodiments, the second metal oxide may be aluminum oxide.

In example embodiments, the image sensor may further include an insulating layer on the second metal oxide film and configured to fill the pixel isolation trench, and the insulating layer may include silicon oxide.

In example embodiments, the image sensor may further include a first hole accumulation region between a lower portion of the first metal oxide film and upper portions of the photoelectric conversion parts, and a second hole accumulation region along a sidewall and a bottom surface of the pixel isolation trench in the substrate.

In example embodiments, the image sensor may further include an air gap inside the pixel isolation trench.

Details of other example embodiments are included in detailed explanations and the drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1:
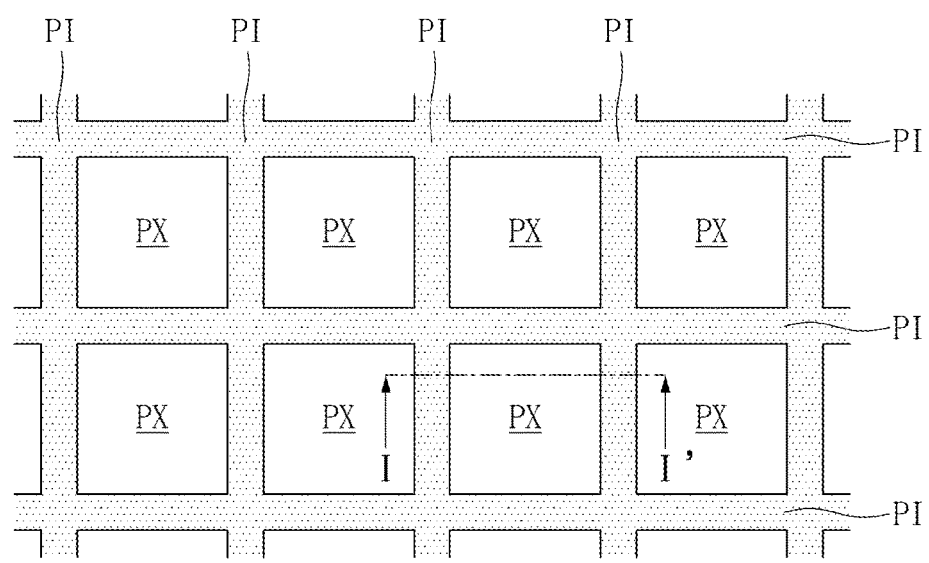
FIG. 1 is a top view illustrating a pixel array of an image sensor according to example embodiments of the inventive concepts.

Advantages and features of the inventive concepts and methods of accomplishing them will be made apparent with reference to the accompanying drawings and some example embodiments to be described below. The inventive concepts may, however, be embodied in various different forms, and should be construed as limited, not by the embodiments set forth herein, but only by the accompanying claims. Rather, these embodiments are provided so that this disclosure is thorough and complete and fully conveys the inventive concepts to those skilled in the art.

The terminology used herein is for the purpose of describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. Like reference numerals throughout this specification denote like elements. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another/other element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

Example embodiments of the inventive concepts will be described with reference to cross-sectional views and/or plan views, which are ideal example views. Thicknesses of layers and regions are exaggerated for effective description of the technical contents in the drawings. Forms of the embodiments may be modified by the manufacturing technology and/or tolerance. Therefore, example embodiments of the inventive concepts are not intended to be limited to illustrated specific forms, and include modifications of forms generated according to manufacturing processes. For example, an etching region illustrated at a right angle may be round or have a given or predetermined curvature. Therefore, regions illustrated in the drawings have overview properties, and shapes of the regions are illustrated special forms of the regions of a device, and are not intended to be limited to the scope of the inventive concepts.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Hereinafter, example embodiments of the inventive concepts will be described with reference to the accompanying drawings.

Figure 2A:
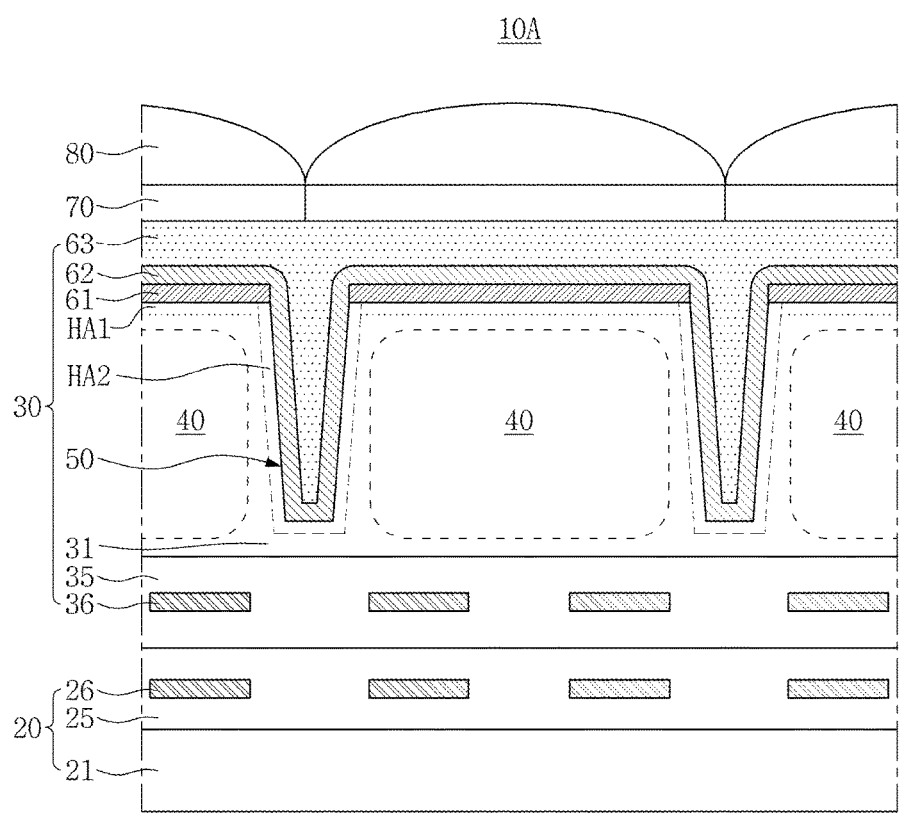
FIGS. 2A and 2B are longitudinal-sectional views taken along line I-I' of FIG. 1.
Figure 2B:
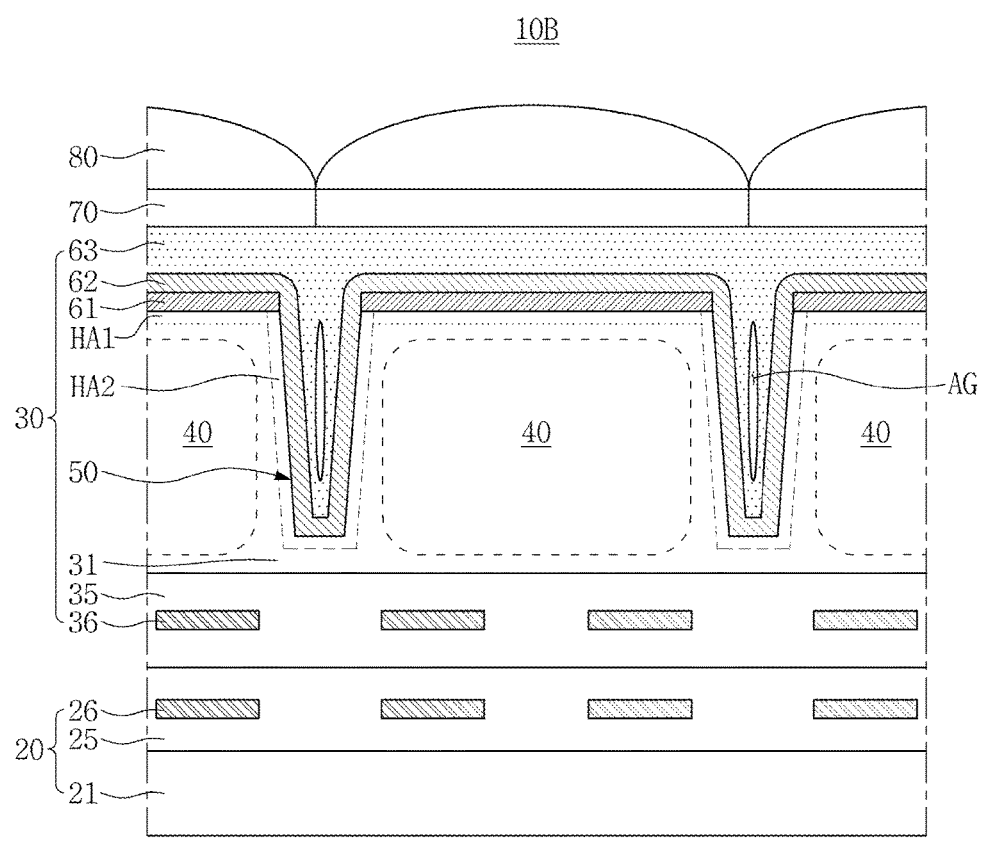

FIG. 1 is a top view illustrating a pixel array of an image sensor according to example embodiments of the inventive concepts. FIGS. 2A and 2B are longitudinal-sectional views taken along line I-I' of FIG. 1. For example, the image sensor may be a backside illumination sensor (BIS) to which example embodiments of the inventive concepts may be applied.

Referring to FIG. 1, an image sensor 10 according to example embodiments of the inventive concepts may include pixel regions PX and pixel isolation regions PI which surround the pixel regions PX. The pixel regions PX may be separated from each other and isolated by the pixel isolation regions PI. The pixel regions PX may include a photoelectric conversion element, e.g., a photo diode, and the pixel isolation regions PI may include an insulator formed in a trench.

Referring to FIG. 2A, the image sensor 10A according to example embodiments of the inventive concepts may include a lower element 20 and an upper element 30. The lower element 20 and the upper element 30 may be bonded to each other.

The lower element 20 may include a lower substrate 21, a lower interlayer insulating layer 25 formed on the lower substrate 21, and lower interconnections 26 buried in the lower interlayer insulating layer 25.

The lower substrate 21 may include any one of a silicon wafer, a silicon germanium wafer, a silicon-on-insulator (SOI) wafer, and a silicon germanium on silicon (SiGe-on-Si) wafer. For example, the lower substrate 21 may include a silicon wafer.

The lower interlayer insulating layer 25 may include silicon oxide. The lower interconnections 26 may include metal lines which extend horizontally, for example, tungsten (W).

The upper element 30 may include an upper substrate 31, photoelectric conversion parts 40 in the upper substrate 31, pixel isolation trenches 50 formed between the photoelectric conversion parts 40, a first insulating layer 61, a second insulating layer 62, and a third insulating layer 63, which are formed on an upper surface of the photoelectric conversion parts 40 and inside the pixel isolation trenches 50, color filters 70 formed on the third insulating layer 63, and micro-lenses 80 respectively formed on the color filters 70. The photoelectric conversion parts 40 may correspond to the pixel regions PX of FIG. 1 and the pixel isolation trenches 50 may correspond to the pixel isolation regions PI of FIG. 1.

The upper substrate 31 may include any one of a silicon wafer or a silicon wafer including an epitaxial growth layer.

Meanwhile, an upper interlayer insulating layer 35 having upper interconnections 36 may be interposed between the upper substrate 31 and the lower interlayer insulating layer 25.

The photoelectric conversion parts 40 may include one of a photo diode, a photo transistor, a photo gate, and a pinned photo diode (PPD). For example, the photoelectric conversion parts 40 may include a photo diode.

The first insulating layer 61 may be directly and conformally formed on a surface of the upper substrate 31, for example, on a surface above the photoelectric conversion part 40 onto which light is incident. The first insulating layer 61 may include a metal oxide layer having a high-k dielectric constant, e.g., a layer including hafnium oxide ($HfO_2$), hafnium silicon oxide ($Hf_xSi_yO_z$), titanium oxide ($TiO_2$), zirconium oxide ($ZrO_2$), magnesium oxide (MgO), tantalum oxide ($Ta_2O_5$), scandium oxide ($Sc_2O_3$), lutetium oxide ($Lu_2O_3$), yttrium oxide ($Y_2O_3$), or lanthanum oxide ($La_2O_3$).

The first insulating layer 61 may be a first fixed charge film. Specifically, the first insulating layer 61 may induce hole accumulation on a lower boundary of the first insulating layer 61, that is, in a region between the first insulating layer 61 and upper portions of the photoelectric conversion parts 40. For example, because the first insulating layer 61 includes an electron-rich metal oxide layer, the first insulating layer 61 may induce hole accumulation on a lower surface of the first insulating layer 61. The holes accumulated on the lower surface of the first insulating layer 61 may collect thermal electrons generated in a silicon surface of the upper substrate 31 and/or in a region adjacent to the silicon surface. That is, a first hole accumulation region HA1 may be formed by the first insulating layer 61. Therefore, the first insulating layer 61 may prevent or suppress a dark current, dark level defects, white spot defects, and/or blooming defects of the photoelectric conversion part 40. Therefore, the photoelectric conversion characteristics of the photoelectric conversion parts 40 can be improved.

In addition, the first insulating layer 61 may be an anti-reflection layer. Specifically, the first insulating layer 61 may prevent or suppress light incident onto the photoelectric conversion parts 40 from being reflected by the surface of the upper substrate 31. That is, the first insulating layer 61 may induce hole accumulation and prevent or suppress the light incident on the photoelectric conversion parts 40 from being reflected. Therefore, the light-receiving efficiency of the photoelectric conversion parts 40 may be improved.

In the pixel array of FIG. 1, surfaces of the pixel regions PX, that is, the surface of the upper substrate 31 may be fully covered by the first insulating layer 61. The first insulating layer 61 may not extend into the pixel isolation trenches 50. Specifically, the first insulating layer 61 may not be formed on inner walls and/or bottoms of the pixel isolation trenches 50. Because the pixel isolation trenches 50 are not light-receiving surfaces, the photoelectric conversion parts 40 onto which light is incident, there is no need to form the anti-reflection layer on the inner walls and/or the bottoms of the pixel isolation trenches 50. Therefore, because the image sensor 10A according to example embodiments of the inventive concepts has no anti-reflection layer, a horizontal width of the pixel isolation trench 50 may be reduced and a degree of integration of the image sensor 10A may be improved.

The second insulating layer 62 may be directly and conformally formed on an upper surface and side surfaces of the first insulating layer 61, and the inner walls and the bottoms of the pixel isolation trenches 50. The pixel isolation trenches 50 may extend between the photoelectric conversion parts 40 from the surface of the upper substrate 31 and define the photoelectric conversion parts 40. The second insulating layer 62 may include an electron-rich metal oxide layer, e.g., an aluminum oxide ($Al_2O_3$) layer.

The second insulating layer 62 may be a second fixed charge film. Specifically, the second insulating layer 62 may induce hole accumulation. That is, due to the formation of the second insulating layer 62, a second hole accumulation region HA2 may be formed in the upper substrate 31 along sidewalls and the bottoms of the pixel isolation trenches 50. Therefore, a dark current, dark level defects, white spot defects, and/or blooming defects may be further prevented and suppressed from being generated on the surface of the upper substrate 31, that is, in a region adjacent to the light-receiving surfaces of the photoelectric conversion parts 40. Further, the second insulating layer 62 may be directly and conformally formed on inner walls and the bottoms of the pixel isolation trenches 50. Therefore, the second insulating layer 62 may prevent and suppress a dark current, dark level defects, white spot defects, and/or blooming defects from being generated in the pixel isolation trenches 50 or side surfaces of the photoelectric conversion parts 40 adjacent to the pixel isolation trenches 50.

The second insulating layer 62 may be a moisture protection layer. Specifically, the second insulating layer 62 may prevent and suppress moisture from being penetrated into the first insulating layer 61 and the upper substrate 31. Therefore, the reliability of the photoelectric conversion parts 40 of the image sensor 10A can be improved.

In the image sensor 10A according to example embodiments of the inventive concepts, because the moisture protection layer is formed on the anti-reflection layer, a single moisture protection layer may protect both of the anti-reflection layer and the substrate. For example, there is no need to additionally form the moisture protection layer, e.g., a silicon nitride (SiN) layer, on the first insulating layer 61. Therefore, because intervals (heights) between the photoelectric conversion parts 40 and the color filters 70 and the micro-lenses 80 can be reduced, the light-receiving efficiency of the image sensor 10A and the photoelectric conversion efficiency of the photoelectric conversion parts 40 may be improved.

A refractive index of hafnium oxide ($HfO_2$) described as an example of the first insulating layer 61 is about 2.0, a refractive index of titanium oxide ($TiO_2$) is about 2.6, and a refractive index of zirconium oxide ($ZrO_2$) is about 2.2. Meanwhile, a refractive index of aluminum oxide ($Al_2O_3$) used as the second insulating layer 62 is about 1.63. Therefore, the first insulating layer 61 is formed of a material having a higher refractive index than the second insulating layer 62, and thus, has an improved anti-reflection characteristic.

Because hafnium oxide ($HfO_2$), hafnium silicon oxide ($Hf_xSi_yO_z$) layer, titanium oxide ($TiO_2$), zirconium oxide ($ZrO_2$), magnesium oxide (MgO), tantalum oxide ($Ta_2O_5$), scandium oxide ($Sc_2O_3$), lutetium oxide ($Lu_2O_3$), yttrium oxide ($Y_2O_3$), lanthanum oxide ($La_2O_3$), etc., which may be used in the first insulating layer 61, are vulnerable to moisture, aluminum oxide ($Al_2O_3$) used as the second insulating layer 62 on the first insulating layer 61 may protect the hafnium oxide ($HfO_2$) and the upper substrate 31 from moisture.

The image sensor 10A according to example embodiments of the inventive concepts may have hole accumulation layers formed in two layers on the light-receiving surfaces of the photoelectric conversion parts 40, and a hole accumulation layer formed in a single-layer on the inner walls and the bottoms of the pixel isolation trenches 50.

The third insulating layer 63 may be formed on the second insulating layer 62 and may fill the pixel isolation trenches 50. The third insulating layer 63 may have a greater thickness than the first insulating layer 61 and the second insulating layer 62. The third insulating layer 63 may include an insulator, e.g., silicon oxide ($SiO_2$). The third insulating layer 63 may have a lower dielectric constant and improved filling characteristic compared with the first insulating layer 61 and the second insulating layer 62.

Referring to FIG. 2B, an image sensor 10B according to example embodiments of the inventive concepts may further include air gaps AG formed in the pixel isolation trenches 50. Because the air gap AG has a lower refractive index, crosstalk between the photoelectric conversion parts 40 may be reduced.

FIGS. 3A to 3F are schematic views for describing a method of forming the image sensor 10A according to example embodiments of the inventive concepts.

Figure 3A:
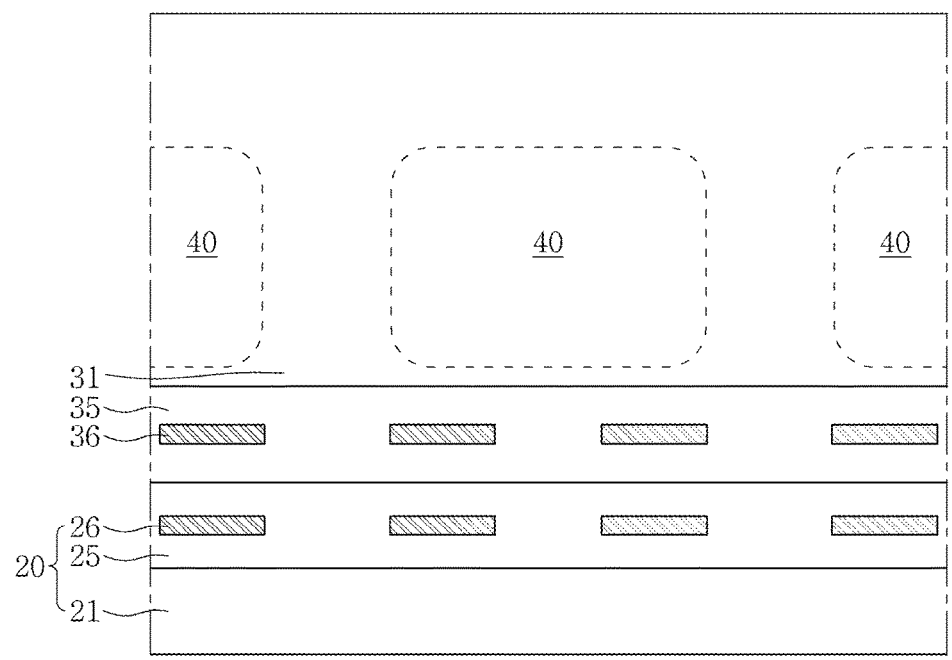
FIGS. 3A to 3F are schematic views for describing a method of forming an image sensor according to example embodiments of the inventive concepts.

Referring to FIG. 3A, the method of forming the image sensor 10A according to example embodiments of the inventive concepts may include providing a lower substrate 21, forming a lower interlayer insulating layer 25 having lower interconnections 26 on one surface of the lower substrate 21, providing an upper substrate 31, forming photoelectric conversion parts 40 in the upper substrate 31, and forming an upper interlayer insulating layer 35 having upper interconnections 36 on a first surface of the upper substrate 31, for example, on a lower surface of the upper substrate 31.

For example, the method may include forming the lower interconnections 26 including a metal, e.g., tungsten (W), on the one surface of the lower substrate 21 including a silicon wafer, and forming the lower interlayer insulating layer 25 which surrounds the lower interconnections 26 on the lower substrate 21. The lower interlayer insulating layer 25 may include silicon oxide ($SiO_2$). The lower interlayer insulating layer 25 may be formed in multiple layers.

For example, the method may include forming the upper interconnections 36 including a metal, e.g., tungsten (W), on the lower surface of the upper substrate 31 including a silicon wafer, and forming the upper interlayer insulating layer 35 which surrounds the upper interconnections 36 on the upper substrate 31. The upper interlayer insulating layer 35 may include silicon oxide ($SiO_2$). The upper interlayer insulating layer 35 may be formed in multiple layers.

Forming the photoelectric conversion parts 40 may include performing an ion implantation process. The photoelectric conversion parts 40 may also be formed in a subsequent process.

Figure 3B:
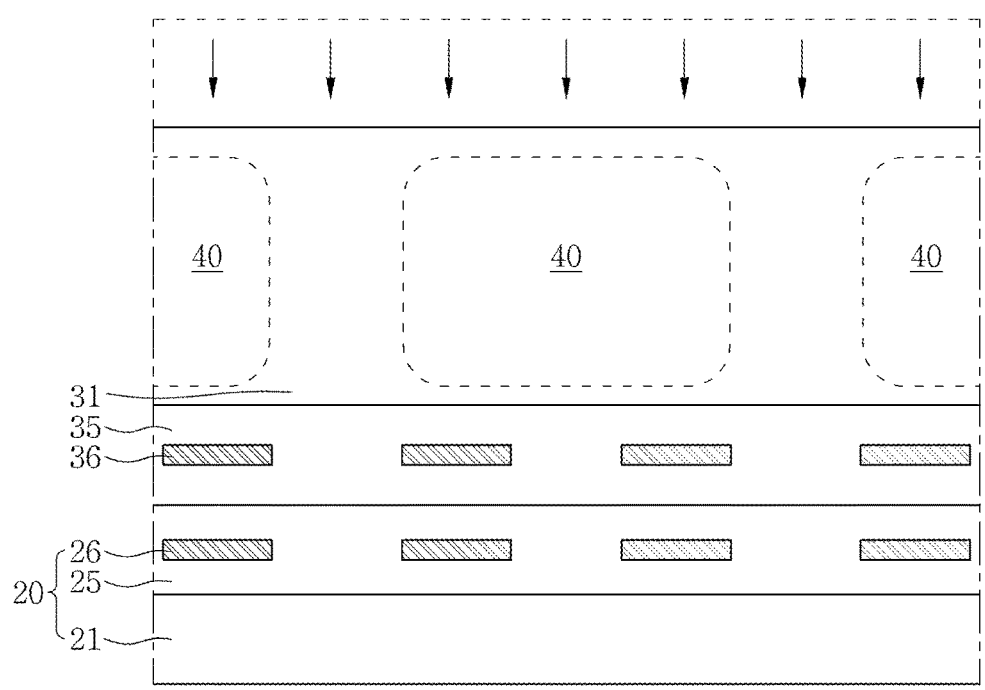

Referring to FIG. 3B, the method may include bonding the lower interlayer insulating layer 25 on the lower substrate 21 to the upper interlayer insulating layer 35 on the lower surface of the upper substrate 31, and thinning the upper substrate 31. The thinning of the upper substrate 31 may include performing a grinding process on an upper surface of the upper substrate 31.

Figure 3C:
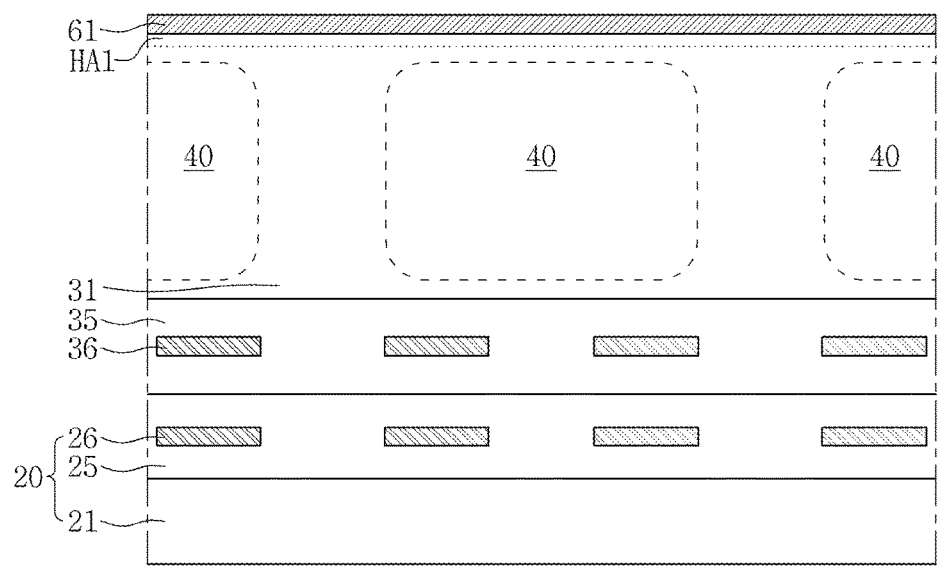

Referring to FIG. 3C, the method may include directly and conformally forming a first insulating layer 61 on the upper surface of the upper substrate 31. The first insulating layer 61 may include a metal oxide, e.g., hafnium oxide ($HfO_2$), hafnium silicon oxide ($Hf_xSi_yO_z$), titanium oxide ($TiO_2$), zirconium oxide ($ZrO_2$), magnesium oxide (MgO), tantalum oxide ($Ta_2O_5$), scandium oxide ($Sc_2O_3$), lutetium oxide ($Lu_2O_3$), yttrium oxide ($Y_2O_3$), and lanthanum oxide ($La_2O_3$), which is formed by an atomic layered deposition (ALD) process. A first hole accumulation region HA1 may be formed on a lower surface of the first insulating layer 61. The photoelectric conversion parts 40 may also be formed before the first insulating layer 61 is formed.

Figure 3D:
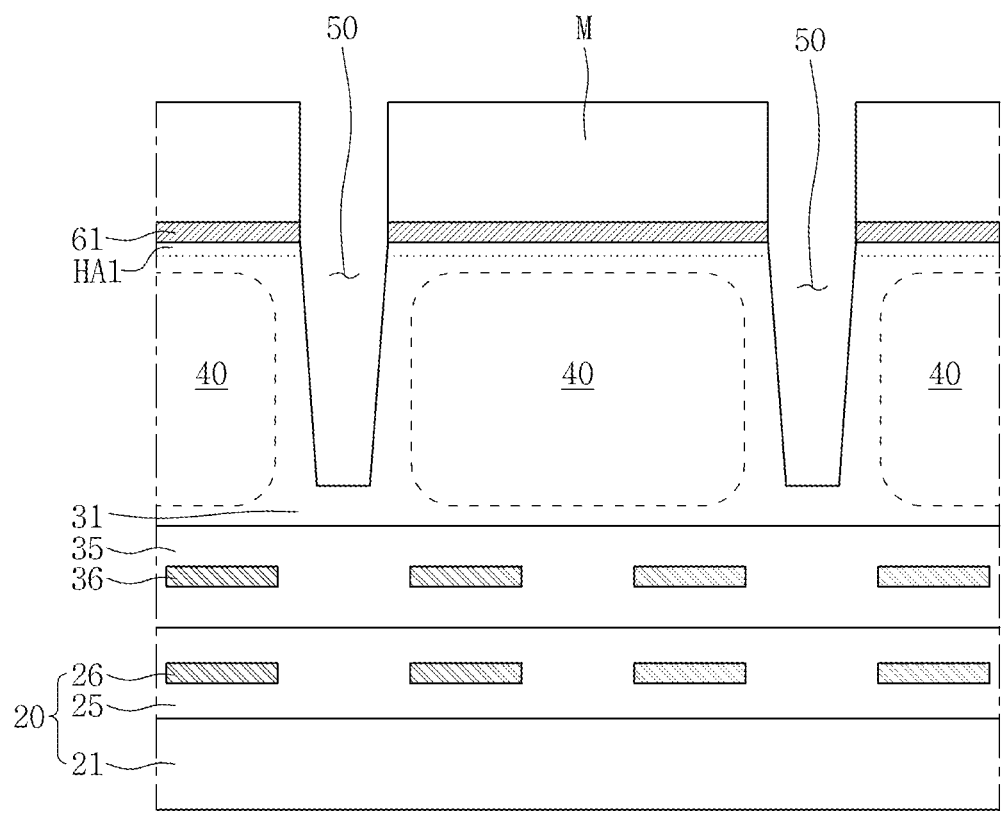

Referring to FIG. 3D, the method may include forming a trench mask M on the first insulating layer 61, and forming pixel isolation trenches 50 in the upper substrate 31 by performing an etching process using the trench mask M as an etching mask. The trench mask M may include a hard mask including a photoresist, silicon nitride (SiN), or silicon oxide ($SiO_2$). Then, the trench mask M may be removed.

Figure 3E:
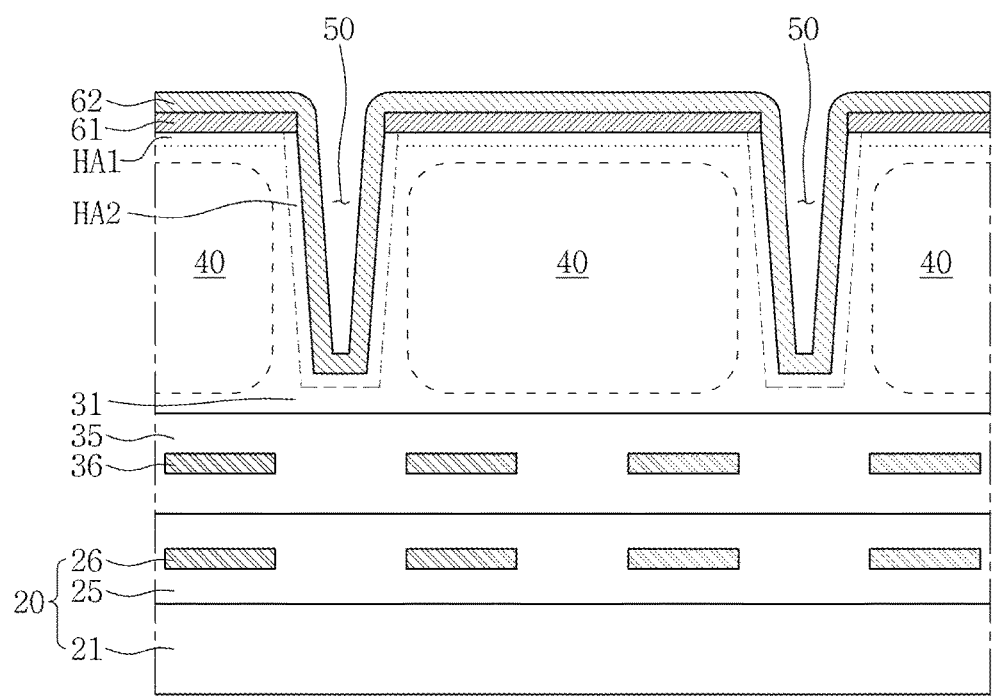

Referring to FIG. 3E, the method may include conformally forming a second insulating layer 62 on an upper surface of the first insulating layer 61, and inner walls and bottoms of the pixel isolation trenches 50. The second insulating layer 62 may include a metal oxide, e.g., aluminum oxide ($Al_2O_3$), formed by an ALD process. Due to forming the second insulating layer 62, a second hole accumulation region HA2 may be formed along the sidewalls and the bottoms of the pixel isolation trenches 50.

The method may include, before the second insulating layer 62 is formed, performing a cleaning process in which natural oxide formed on the inner walls and the bottoms of the pixel isolation trenches 50 is removed. Therefore, the second insulating layer 62 may be directly formed on the inner walls and the bottoms of the pixel isolation trenches 50. The cleaning process may include performing a dry cleaning process using nitrogen trifluoride ($NF_3$) or a wet cleaning process using hydrofluoric acid (HF).

Figure 3F:
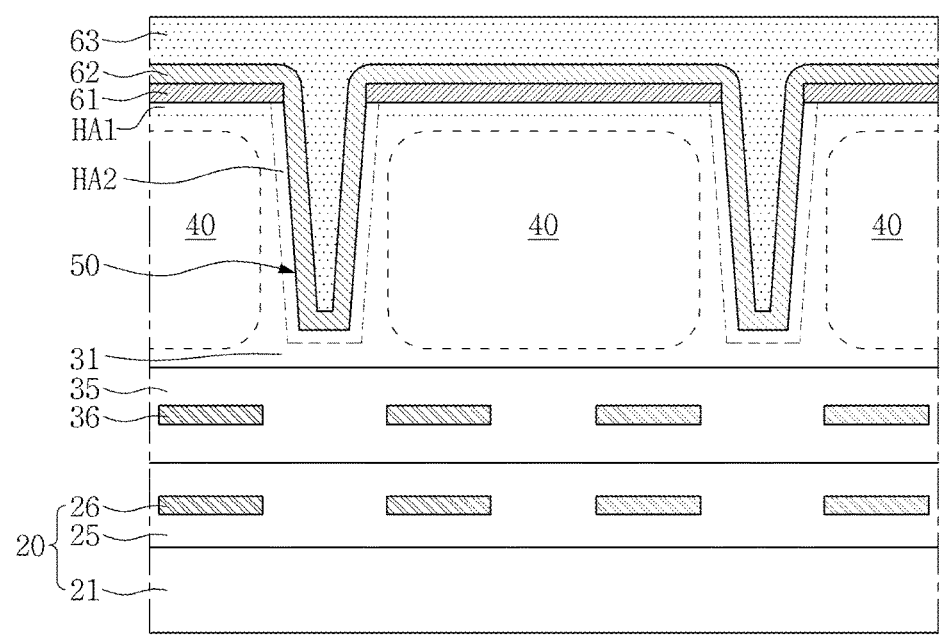

Referring to FIG. 3F, the method may include forming a third insulating layer 63 which fills the pixel isolation trenches 50 on the second insulating layer 62 by performing one of a deposition process, a filling process, and a coating process. The method may further include planarizing an upper surface of the third insulating layer 63 by performing a chemical mechanical polishing (CMP) process.

Then, referring to FIG. 2A, the method may include forming color filters 70 vertically arranged with the photoelectric conversion parts 40 on the third insulating layer 63, and forming micro-lenses 80 on the color filters 70.

Figure 4:
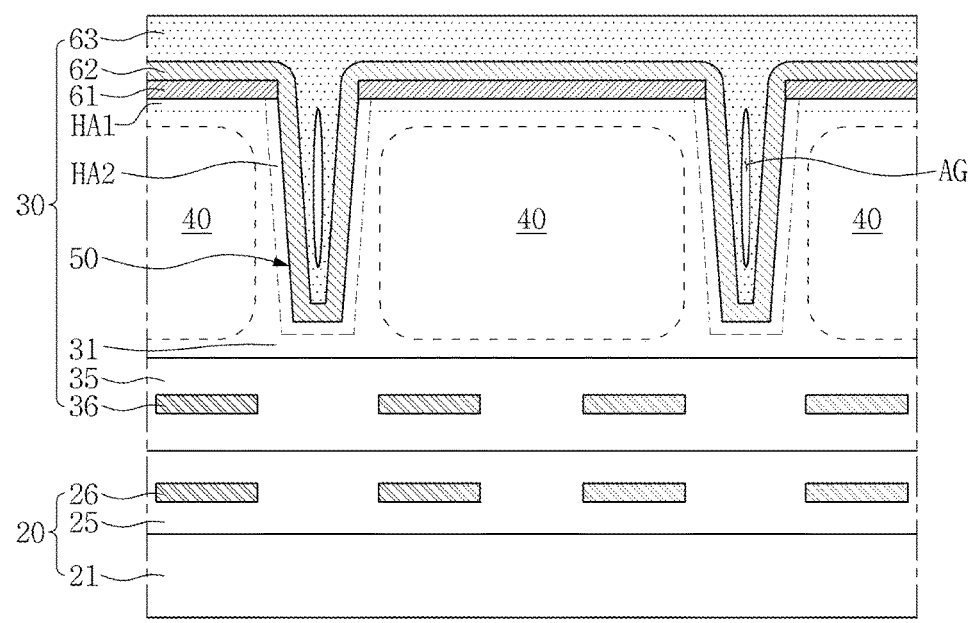
FIG. 4 is a schematic view for describing a method of forming an image sensor according to example embodiments of the inventive concepts.

FIG. 4 is a schematic view for describing a method of forming an image sensor 10B according to example embodiments of the inventive concepts as illustrated in FIG. 2B. Referring to FIG. 4, the method of forming the image sensor 10B according to example embodiments of the inventive concepts may include performing the processes described with reference to FIGS. 3A to 3F, and forming a third insulating layer 63 to form air gaps AG in pixel isolation trenches 50. For example, the method may include performing a deposition process or a filling process by reducing fluidity and/or a gap fill characteristic of an insulator for forming the third insulating layer 63. The method may further include planarizing an upper surface of the third insulating layer 63 by performing a CMP process.

Then, with reference to FIG. 2B, the method may include forming the color filters 70 vertically arranged with the photoelectric conversion parts 40 on the third insulating layer 63, and forming the micro-lenses 80 on the color filters 70.

Figure 5:
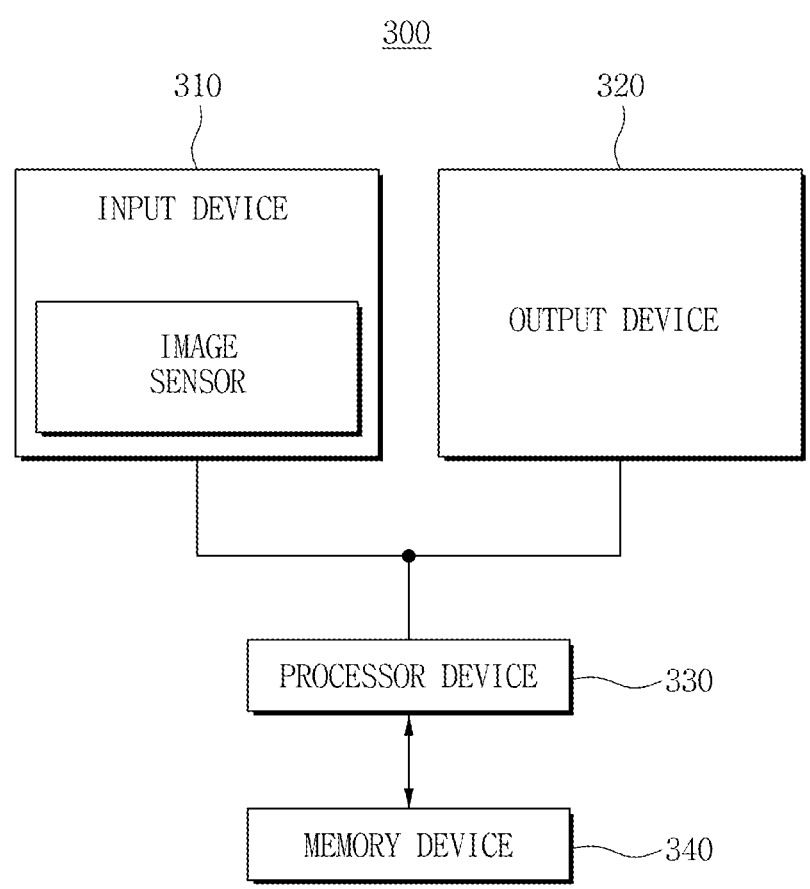
FIG. 5 is a block diagram illustrating an electronic system including one of the image sensors according to example embodiments of the inventive concepts.

FIG. 5 is a block diagram illustrating an electronic system 300 including one of the image sensors 10A and 10B according to example embodiments of the inventive concepts. Referring to FIG. 5, the electronic system 300 according to example embodiments of the inventive concepts may include an input device 310, an output device 320, a processor device 330, and a memory device 340. The processor device 330 may control the input device 310, the output device 320, and the memory device 340 through each corresponding interface. The electronic system 300 may further include a port which may communicate with a video card, a sound card, and a Universal Serial Bus (USB) device, or communicate with other systems. For example, the electronic system 300 may be a computer system, a camera system, a scanner, a car navigation system, a video phone, a surveillance system, an auto focus system, a tracking system, a motion detection system, an image stabilization system, or other systems using image sensors. The input device 310 may include an image sensor 10A and 10B. For example, the input device 310 may include at least one of the image sensors 10A and 10B according to example embodiments of the inventive concepts. The processor device 330 may include at least one of a microprocessor, a digital signal processor, a micro controller, and logic devices which perform a function similar thereto. The input device 310 and the output device 320 may include at least one device which may input and output data.

Figure 6:
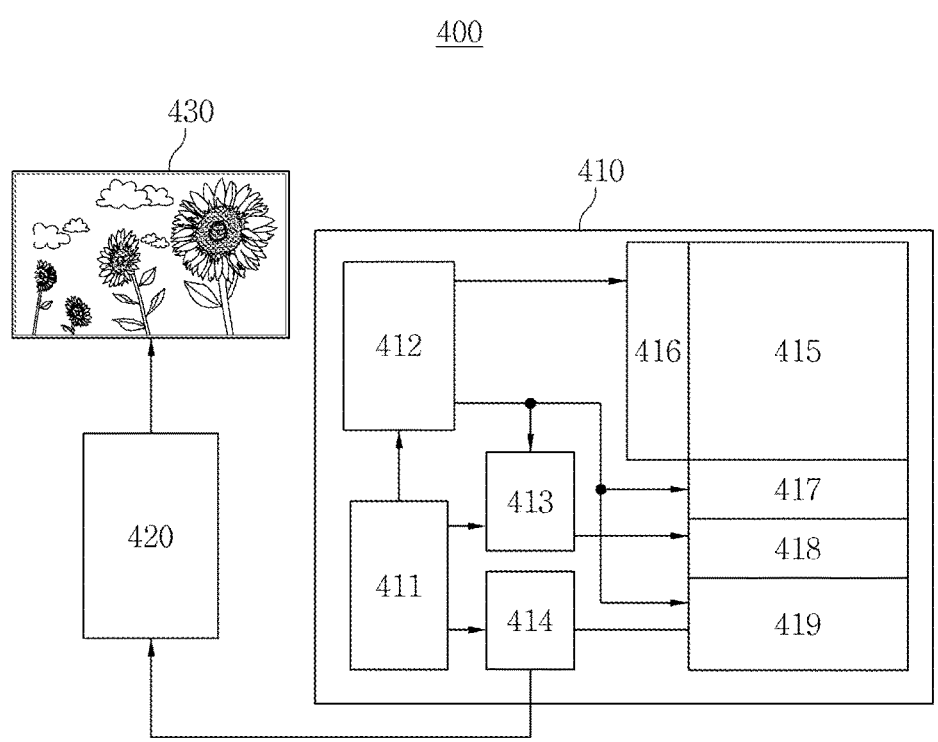
FIG. 6 is a schematic block diagram for describing a camera system including one of the image sensors according to example embodiments of the inventive concepts.

FIG. 6 is a schematic block diagram for describing a camera system 400 including one of the image sensors 10A and 10B according to example embodiments of the inventive concepts. Referring to FIG. 6, the camera system 400 according to example embodiments of the inventive concepts may include an image sensing part 410, an image signal processing part 420, and an image display part 430. The image sensing part 410 may include a control register block 411, a timing generator 412, a ramp generator 413, a buffer part 414, an active pixel sensor array 415, a row driver 416, a correlated double sampler (CDS) 417, a comparator 418, and an analog-to-digital conversion part 419. The control register block 411 may control overall operations of the camera system 400. Specifically, an operating signal may be directly transmitted to the timing generator 412, the ramp generator 413, and the buffer part 414. The timing generator 412 may generate a signal serving as a reference of operation timing of various components of the image sensing part 410. The operation timing reference signal generated from the timing generator 412 may be transferred to the row driver 416, the CDS 417, the comparator 418, and/or the analog-to-digital conversion part 419. The ramp generator 413 may generate and transmit a ramp signal used in the CDS 417 and/or the comparator 418. The buffer part 414 may include a latch part. The buffer part 414 may temporarily store an image signal to be transmitted to the external environment. The active pixel sensor array 415 may sense an external image. The active pixel sensor array 415 may include a plurality of active pixel sensors, and each of the active pixel sensors may include one of the image sensors 10A and 10B according to example embodiments of the inventive concepts. The row driver 416 may selectively activate a row of the active pixel sensor array 415. The CDS 417 may sample and output an analog signal generated from the active pixel sensor array 415. The comparator 418 may compare data transmitted from the CDS 417 to a slope of a ramp signal fed back through analog reference voltages thereof to generate various reference signals. The analog-to-digital conversion part 419 may convert analog image data into digital image data.

Because the image sensors according to example embodiments of the inventive concepts each include a hafnium oxide ($HfO_2$) layer or a hafnium silicon oxide ($Hf_xSi_yO_z$) layer, which is directly formed on a silicon surface of a substrate, the image sensors can effectively accumulate holes. Therefore, the image sensors can efficiently collect thermal electrons generated in the substrate. Accordingly, the image sensors can prevent or suppress a dark current, dark level defects, or white spot defects from being generated.

Because the image sensors according to example embodiments of the inventive concepts each include an anti-reflection layer directly formed on a light-receiving surface of the substrate and a moisture protection layer formed on the anti-reflection layer, moisture can be prevented or suppressed from being penetrated into the anti-reflection layer and the substrate by the single moisture protection layer.

Because the image sensors according to example embodiments of the inventive concepts each include the moisture protection layer capable of inducing hole accumulation formed on the anti-reflection layer also capable of inducing hole accumulation, the anti-reflection layer which may not induce hole accumulation, e.g., a silicon nitride (SiN) layer, and/or a moisture protection layer which may not induce hole accumulation are not necessary. Therefore, an overall thickness of the insulating layer can be reduced, and the light-receiving efficiency of the image sensor can be improved.

In the image sensors according to example embodiments of the inventive concepts, because the anti-reflection layer is not included inside a pixel isolation trench which does not receive light, a horizontal width of the pixel isolation trench can be reduced. Therefore, a relatively high quality image sensor may be formed.

In the image sensors according to example embodiments of the inventive concepts, because an air gap may be formed inside the pixel isolation trench, crosstalk between photoelectric conversion parts can be reduced.

In addition, there may be various effects of the inventive concepts which are not described in the detailed description.

Although a few example embodiments have been described with reference to the accompanying drawings, those skilled in the art will readily appreciate that many modifications are possible in embodiments without departing from the scope of the inventive concepts and without changing essential features. Therefore, the above-described embodiments should be considered in a descriptive sense only and not for purposes of limitation.

What is claimed is:

1. An image sensor comprising:
a substrate including a plurality of photoelectric conversion parts and a pixel isolation trench extending from a surface of the substrate between the photoelectric conversion parts;
a first fixed charge film directly on the surface of the substrate;
a second fixed charge film directly on the first fixed charge film and an inner wall of the pixel isolation trench; and
an insulating layer directly on the second fixed charge film, the insulating layer configured to fill the pixel isolation trench.

2. The image sensor of claim 1, wherein
the first fixed charge film and the second fixed charge film include a metal oxide; and
the insulating layer includes a non-metal oxide.

3. The image sensor of claim 2, wherein the first fixed charge film includes one of hafnium oxide, hafnium silicon oxide, titanium oxide, zirconium oxide, magnesium oxide, tantalum oxide, scandium oxide, lutetium oxide, yttrium oxide, and lanthanum oxide.

4. The image sensor of claim 2, wherein the second fixed charge film includes aluminum oxide.

5. The image sensor of claim 2, wherein the insulating layer includes silicon oxide.

6. The image sensor of claim 1, further comprising:
a first hole accumulation region between a lower portion of the first fixed charge film and upper portions of the photoelectric conversion parts; and
a second hole accumulation region along a sidewall and a bottom surface of the pixel isolation trench in the substrate.

7. The image sensor of claim 6, wherein
the first fixed charge film and the second fixed charge film include different metals;
the first fixed charge film and the second fixed charge film are on the first hole accumulation region; and
the second fixed charge film is on side surfaces of the second hole accumulation region.

8. The image sensor of claim 1, wherein the insulating layer has a planar upper surface configured to extend onto the second fixed charge film.

9. The image sensor of claim 1, further comprising:
an air gap inside the pixel isolation trench.

10. An image sensor comprising:
a lower substrate;
a lower interlayer insulating layer on the lower substrate;
an upper interlayer insulating layer on the lower interlayer insulating layer;
an upper substrate on the upper interlayer insulating layer, the upper substrate including a pixel isolation trench configured to define pixel regions in the upper substrate, and extending into the upper substrate from an upper surface of the upper substrate;
a first insulating layer directly on the upper surface of the upper substrate, the first insulating layer including a metal oxide;
a second insulating layer directly on the first insulating layer and inner walls of the pixel isolation trench, the second insulating layer including a metal oxide having a lower refractive index than the first insulating layer; and
a third insulating layer directly on the second insulating layer, the third insulating layer configured to fill the pixel isolation trench.

11. The image sensor of claim 10, wherein the first insulating layer does not extend into the pixel isolation trench.

12. The image sensor of claim 10, further comprising:
a plurality of color filters on the third insulating layer, the color filters vertically arranged with the photoelectric conversion parts; and
a plurality of micro-lenses on the color filters.

13. The image sensor of claim 10, wherein
the lower interlayer insulating layer includes a lower interconnection; and
the upper interlayer insulating layer includes an upper interconnection.

14. The image sensor of claim 10, wherein
the first insulating layer and the second insulating layer are on the upper surface of the upper substrate;
the first insulating layer and the second insulating layer include different metals; and
the second insulating layer is on the inner walls and a bottom surface of the pixel isolation trench.

15. An image sensor comprising:
a substrate including a plurality of photoelectric conversion parts and a pixel isolation trench configured to extend between the photoelectric conversion parts from a surface of the substrate;
a first metal oxide film conformally formed on the surface of the substrate, the first metal oxide film including a first metal oxide; and
a second metal oxide film conformally formed on the first metal oxide film and an inner wall of the pixel isolation trench, the second metal oxide film including a second metal oxide different from the first metal oxide.

16. The image sensor of claim 15, wherein the first metal oxide includes one of hafnium oxide, hafnium silicon oxide, titanium oxide, zirconium oxide, magnesium oxide, tantalum oxide, scandium oxide, lutetium oxide, yttrium oxide, and lanthanum oxide.

17. The image sensor of claim 15, wherein the second metal oxide is aluminum oxide.

18. The image sensor of claim 15, further comprising:
an insulating layer on the second metal oxide film and configured to fill the pixel isolation trench, the insulating layer including silicon oxide.

19. The image sensor of claim 15, further comprising:
a first hole accumulation region between a lower portion of the first metal oxide film and upper portions of the photoelectric conversion parts; and
a second hole accumulation region along a sidewall and a bottom surface of the pixel isolation trench in the substrate.

20. The image sensor of claim 15, further comprising:
an air gap inside the pixel isolation trench.

* * * * *